(12) United States Patent
Chou et al.

(10) Patent No.: US 7,843,279 B2
(45) Date of Patent: Nov. 30, 2010

(54) LOW TEMPERATURE COEFFICIENT OSCILLATOR

(75) Inventors: Yi-Chung Chou, Taipei (TW);
Tung-Shan Chen, Hsinchu County (TW)

(73) Assignee: ITE Tech, Inc., Hsinchu (TW)

( * ) Notice: Subject to any disclaimer, the term of this patent is extended or adjusted under 35 U.S.C. 154(b) by 94 days.

(21) Appl. No.: 12/406,953

(22) Filed: Mar. 18, 2009

(65) Prior Publication Data

US 2010/0171559 A1      Jul. 8, 2010

(30) Foreign Application Priority Data

Jan. 6, 2009      (TW) .............................. 98100169 A

(51) Int. Cl.
*H03K 3/0231*     (2006.01)
*H03L 1/02*     (2006.01)
(52) U.S. Cl. ...................... 331/111; 331/143; 331/176; 331/185
(58) Field of Classification Search ................. 331/111, 331/143, 175, 176, 185, 186
See application file for complete search history.

(56) References Cited

U.S. PATENT DOCUMENTS

| 6,020,792 | A  | * | 2/2000 | Nolan et al. ................. 331/111 |
| 7,034,627 | B1 |   | 4/2006 | Kudari |
| 7,548,131 | B2 | * | 6/2009 | Noguchi ...................... 331/176 |

* cited by examiner

*Primary Examiner*—Robert Pascal
*Assistant Examiner*—Ryan Johnson
(74) *Attorney, Agent, or Firm*—Jianq Chyun IP Office

(57) ABSTRACT

A low temperature coefficient oscillator including a current generator, a first and a second voltage generator, an amplifier, a resistor, a switch, a capacitor and an oscillating unit is provided. The current generator generates a first through a fourth current according to a control signal. The first voltage generator generates a first voltage according to the first current. The second voltage generator generates a second voltage according to the second current and a frequency signal. The amplifier generates the control signal according the first and second voltages. The resistor is coupled between a first terminal of the switch and ground, and a first terminal thereof receives the third current. The switch is conducted or not according the frequency signal. The capacitor is coupled between a second terminal of the switch and ground. The oscillating unit generates the frequency signal according to the fourth current and a voltage of the capacitor.

6 Claims, 4 Drawing Sheets

LOW TEMPERATURE COEFFICIENT OSCILLATOR

CROSS-REFERENCE TO RELATED APPLICATION

This application claims the priority benefit of Taiwan application serial no. 98100169, filed Jan. 6, 2009. The entirety of the above-mentioned patent application is hereby incorporated by reference herein and made a part of specification.

BACKGROUND OF THE INVENTION

1. Field of the Invention

The present invention relates to an oscillator. More particularly, the present invention relates to a low temperature coefficient oscillator.

2. Description of Related Art

FIG. 1 is a schematic diagram illustrating a conventional silicon oscillator. Referring to FIG. 1, the silicon oscillator 100 charges a capacitor through a current I. When the capacitor is charged to a predetermined voltage V, a switch is triggered and is turned on, so that capacitor is discharged to the ground GND. Then, the switch is turned off, and the capacitor is recharged. By such means, the capacitor is repeatedly charged/discharged, so that the silicon oscillator 100 can generate a fixed frequency f (f~|I/(C*V)).

If the frequency f not influenced by temperature variation is required to be generated, the current source circuit 110, the voltage source circuit 120 and the capacitance of the capacitor have to have very small temperature coefficients. FIG. 2A is a schematic diagram illustrating the current source circuit 110 of FIG. 1. FIG. 2B is a schematic diagram illustrating the voltage source circuit 120 of FIG. 1. Referring to FIG. 2A and FIG. 2B, the current source circuit 110 can generate a low temperature coefficient current source I based on the ratios among resistors R11 and R21, the positive temperature coefficient characteristic thereof and the negative temperature coefficient characteristic of the transistors Q11 and Q12. Moreover, the voltage source circuit 120 can generate a low temperature coefficient voltage source V based on the ratios among resistors R11, R31 and R41, the positive temperature coefficient characteristic thereof and the negative temperature coefficient characteristic of the transistors Q11 and Q12. Though, all of the aforementioned circuits can be integrated within a signal circuit, the voltage source and the current source with low temperature coefficient have to be applied, so that a circuit area of the oscillator 100 is relatively large during a chip fabrication.

Moreover, a U.S. Patent issued as U.S. Pat. No. 7,034,627 discloses an oscillator circuit (not shown) in which a low temperature coefficient constant resistance circuit is applied to achieve a low temperature coefficient frequency output. Since currents generated by a current mirror circuit in the oscillator circuit have the same temperature coefficient, the voltage and charge current used for generating the output frequency of the oscillator circuit also have the same temperature coefficient, and since the resistor generally has a relatively high temperature coefficient during a semiconductor fabrication process, if the resistor is integrated to the low temperature coefficient frequency oscillator circuit during the semiconductor fabrication process, the output frequency generated by the oscillator circuit can be influenced by the temperature, which may cause a wrong operation of the circuit.

SUMMARY OF THE INVENTION

The present invention is related to a low temperature coefficient oscillator, which can generate a frequency with a low temperature coefficient, and an area of the low temperature coefficient oscillator can be reduced when a chip thereof is fabricated, and a resistor having the temperature coefficient can also be fabricated in the chip of the low temperature coefficient oscillator.

The present invention provides a low temperature coefficient oscillator including a current generator, a first voltage generator, a second voltage generator, an amplifier, a first resistor, a first switch, a first capacitor and an oscillating unit. The current generator generates a first current, a second current, a third current and a fourth current according to a control signal. The first voltage generator is coupled to the current generator, and generates a first voltage according to the first current. The second voltage generator is coupled to the current generator, and generates a second voltage according to the second current and a frequency signal. The amplifier generates the control signal according to the first voltage and the second voltage. A first terminal of the first resistor receives the third current, and a second terminal of the first resistor is coupled to the ground. A first terminal of the first switch is coupled to the first terminal of the first resistor, and the first switch determines whether to be conducted according to the frequency signal. A first terminal of the first capacitor is coupled to a second terminal of the first switch, and a second terminal of the first capacitor is coupled to the ground. The oscillating unit generates the frequency signal according to the fourth current and a voltage of the first capacitor.

In an embodiment of the present invention, the current generator includes a first transistor, a second transistor, a third transistor and a fourth transistor. A gate of the first transistor receives the control signal, a source of the first transistor receives a third voltage, and a drain of the first transistor generates the first current. A gate of the second transistor receives the control signal, a source of the second transistor receives the third voltage, and a drain of the second transistor generates the second current. A gate of the third transistor receives the control signal, a source of the third transistor receives the third voltage, and a drain of the third transistor generates the third current. A gate of the fourth transistor receives the control signal, a source of the fourth transistor receives the third voltage, and a drain of the fourth transistor generates the fourth current.

In an embodiment of the present invention, the first voltage generator includes a second resistor and a fifth transistor. A first terminal of the second resistor receives the first current and generates the first voltage, and a second terminal of the second resistor is coupled to the ground. A base and a collector of the fifth transistor are coupled to the second terminal of the second resistor, and an emitter of the fifth transistor is coupled to the first terminal of the second resistor.

In an embodiment of the present invention, the second voltage generator includes a third resistor, a sixth transistor, a fourth resistor, a fifth resistor and a second switch. A first terminal of the third resistor receives the second current and generates the second voltage, and a second terminal of the third resistor is coupled to the ground. A base and a collector of the sixth transistor are coupled to the second terminal of the third resistor. A first terminal of the fourth resistor is coupled to an emitter of the sixth transistor. A first terminal of the fifth resistor is coupled to the first terminal of the fourth resistor. A first terminal of the second switch is coupled to the first terminal of the third resistor, wherein a second terminal of the second switch is switched between a second terminal of the fourth resistor and a second terminal of the fifth resistor according to the frequency signal.

In an embodiment of the present invention, the oscillating unit includes a second capacitor, a comparator and a third switch. A first terminal of the second capacitor receives the fourth current, and a second terminal of the second capacitor is coupled to the ground. The comparator has a first terminal, a second terminal and an output terminal wherein the first terminal of the comparator receives the fourth current, the second terminal of the comparator receives the voltage of the first capacitor, and the output terminal of the comparator generates the frequency signal. A first terminal and a second terminal of the third switch are respectively coupled to the first terminal and the second terminal of the second capacitor, wherein the third switch determines whether to be conducted according to the frequency signal.

In an embodiment of the present invention, the second voltage generator includes a sixth resistor, a seventh transistor, a seventh resistor, an eighth resistor and a fourth switch. A first terminal of the sixth resistor receives the second current and generates the second voltage, and a second terminal of the sixth resistor is coupled to the ground. A base and a collector of the seventh transistor are coupled to the second terminal of the sixth resistor. A first terminal of the seventh resistor is coupled to the first terminal of the sixth resistor. A first terminal of the eighth resistor is coupled to the first terminal of the seventh resistor, and a second terminal of the eighth resistor is coupled to an emitter of the seventh transistor. A first terminal and a second terminal of the fourth switch are respectively coupled to the first terminal and a second terminal of the seventh resistor, wherein the fourth switch determines whether to be conducted according to the frequency signal.

In the present invention, whether the first switch is conducted is determined according to the frequency signal, so that the voltage of first capacitor has the low temperature coefficient. On the other hand, the second voltage generator can adjust the second voltage according to the frequency signal, so that the current generated by the current generator can have the low temperature coefficient. By such means, the low temperature coefficient oscillator can generate the low temperature coefficient frequency signal according to the low temperature coefficient voltage and the low temperature coefficient current. Namely, the frequency signal is relatively not influenced by the temperature, so that the frequency signal can be stable, and a circuit area of the low temperature coefficient oscillator can be reduced during a chip fabrication thereof.

In order to make the aforementioned and other objects, features and advantages of the present invention comprehensible, a preferred embodiment accompanied with figures is described detailly as below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the descriptions, serve to explain the principles of the invention.

DESCRIPTION OF EMBODIMENTS

Figure 3:
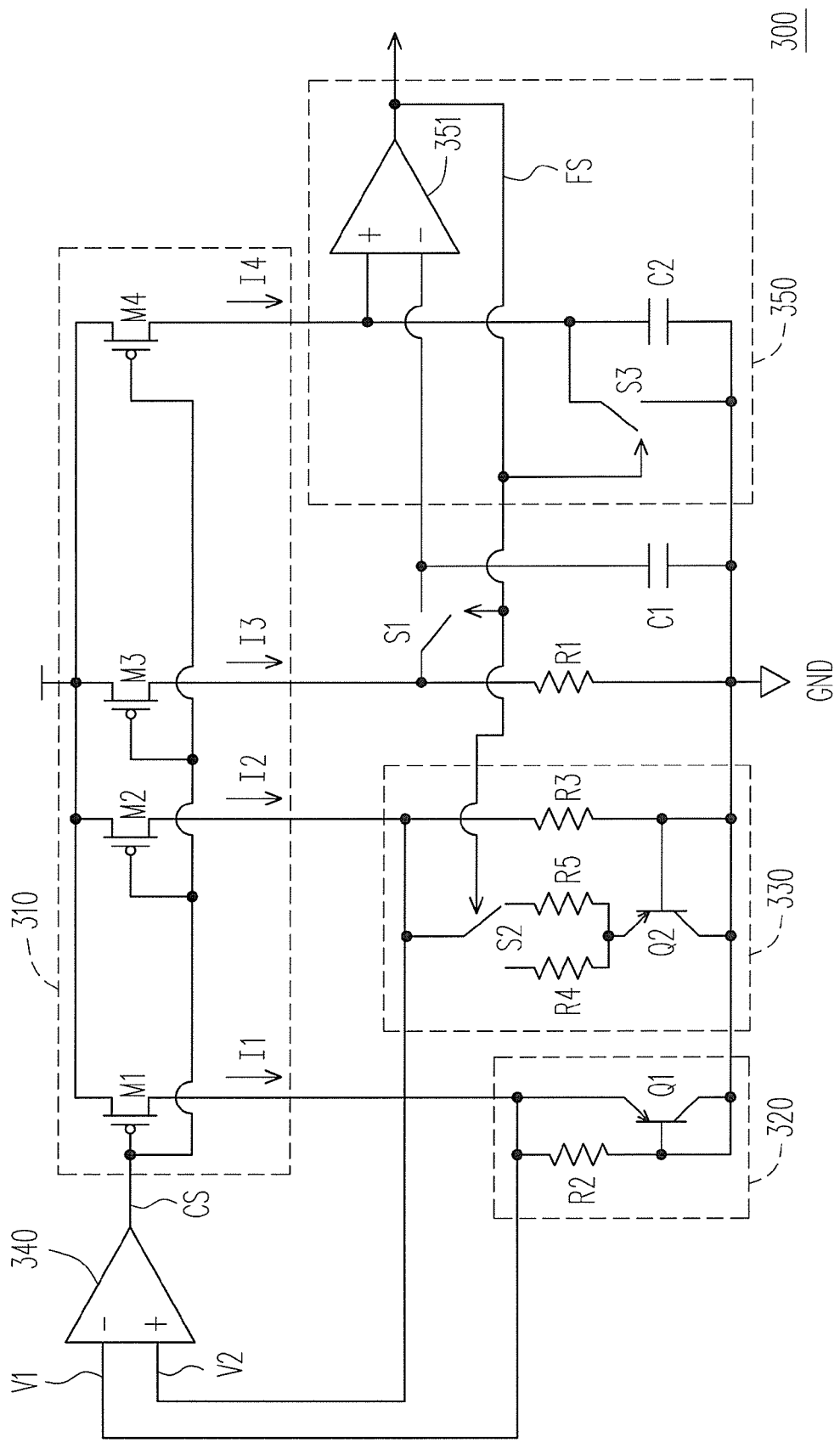
FIG. 3 is a schematic diagram illustrating a low temperature coefficient oscillator according to an embodiment of the present invention.

FIG. 3 is a schematic diagram illustrating a low temperature coefficient oscillator according to an embodiment of the present invention. Referring to FIG. 3, the low temperature coefficient oscillator 300 includes a current generator 310, a first voltage generator 320, a second voltage generator 330, an amplifier 340, a first resistor R1, a first switch S1, a first capacitor C1 and an oscillating unit 350.

The current generator 310 generates a first current I1, a second current I2, a third current I3 and a fourth current I4 according to a control signal CS. The first voltage generator 320 is coupled to the current generator 310, and generates a first voltage V1 according to the first current I1. The second voltage generator 330 is coupled to the current generator 310, and generates a second voltage V2 according to the second current I2 and a frequency signal FS.

The amplifier 340 generates the control signal CS according to the first voltage V1 and the second voltage V2. For example, when the first voltage V1 is smaller than the second voltage V2, the control signal CS is increased so that the first to fourth currents I1-I4 generated by the current generator 310 are decreased, and when the first voltage V1 is larger than the second voltage V2, the control signal CS is decreased so that the first to fourth currents I1-I4 generated by the current generator 310 are increased. A first terminal of the first resistor R1 receives the third current I3, and a second terminal of the first resistor R1 is coupled to the ground GND. A first terminal of the first switch S1 is coupled to the first terminal of the first resistor R1, and the first switch S1 is conducted or not according to the frequency signal FS. For example, when the frequency signal FS has a logic high voltage level, the first switch S1 is conducted, and when the frequency signal FS has a logic low voltage level, the first switch S1 is not conducted. A first terminal of the first capacitor C1 is coupled to a second terminal of the first switch S1, and a second terminal of the first capacitor C1 is coupled to the ground GND. The oscillating unit 350 generates the frequency signal FS according to the fourth current I4 and a voltage of the first capacitor C1.

In the present embodiment, the current generator 310 includes a first transistor M1, a second transistor M2, a third transistor M3 and a fourth transistor M4. A gate of the first transistor M1 receives the control signal CS, a source of the first transistor M1 receives a third voltage (for example, a VDD), and a drain of the first transistor M1 generates the first current I1. A gate of the second transistor M2 receives the control signal CS, a source of the second transistor M2 receives the third voltage, and a drain of the second transistor M2 generates the second current I2. A gate of the third transistor M3 receives the control signal CS, a source of the third transistor M3 receives the third voltage, and a drain of the third transistor M3 generates the third current I3. A gate of the fourth transistor M4 receives the control signal CS, a source of the fourth transistor M4 receives the third voltage, and a drain of the fourth transistor M4 generates the fourth current I4.

The first voltage generator 320 includes a second resistor R2 and a fifth transistor Q1. A first terminal of the second resistor R2 receives the first current I1 and generates the first voltage V1, and a second terminal of the second resistor R2 is coupled to the ground GND. A base and a collector of the fifth transistor Q1 are coupled to the second terminal of the second resistor R2, and an emitter of the fifth transistor Q1 is coupled to the first terminal of the second resistor R2. In the present embodiment, the fifth transistor Q1 is, for example, a PNP transistor.

The second voltage generator 330 includes a third resistor R3, a sixth transistor Q2, a fourth resistor R4, a fifth resistor R5 and a second switch S2. A first terminal of the third resistor R3 receives the second current I2 and generates the second voltage V2, and a second terminal of the third resistor R3 is coupled to the ground GND. A base and a collector of the sixth transistor Q2 are coupled to the second terminal of the third resistor R3. A first terminal of the fourth resistor R4 is coupled to an emitter of the sixth transistor Q2. A first terminal of the fifth resistor R5 is coupled to the first terminal of the fourth resistor R4. A first terminal of the second switch S2 is coupled to the first terminal of the third resistor R3, and a second terminal of the second switch S2 is switched between a second terminal of the fourth resistor R4 and a second terminal of the fifth resistor R5 according to the frequency signal FS.

For example, when the frequency signal FS has the logic high voltage level, the second terminal of the second switch S2 is switched to the second terminal of the fourth resistor R4, and when the frequency signal FS has the logic low voltage level, the second terminal of the second switch S2 is switched to the second terminal of the fifth resistor R5.

In the present embodiment, resistances of the second resistor R2 and the third resistor R3 are the same, resistances of the fourth resistor R4 and the fifth resistor R5 are different, and the sixth transistor Q2 is, for example, the PNP transistor. Moreover, since a temperature coefficient of the PNP transistor and a temperature coefficient of the resistor are in reverse relation to each other, so that the current generator 310 can generate the currents with different temperature coefficients.

The oscillating unit 350 includes a second capacitor C2, a comparator 351 and a third switch S3. A first terminal of the second capacitor C2 receives the fourth current I4, and a second terminal of the second capacitor C2 is coupled to the ground GND. The comparator 351 has a first terminal, a second terminal and an output terminal wherein the first terminal (for example, a positive input terminal) of the comparator 351 receives the fourth current I4, the second terminal (for example, a negative input terminal) of the comparator 351 receives the voltage of the first capacitor C1, and the output terminal of the comparator 351 generates the frequency signal FS.

A first terminal and a second terminal of the third switch S3 are respectively coupled to the first terminal and the second terminal of the second capacitor C2 wherein the third switch S3 is conducted or not according to the frequency signal FS. For example, when the frequency signal FS has the logic high voltage level, the third switch S3 is conducted, and when the frequency signal FS has the logic low voltage level, the third switch S3 is not conducted.

In a whole operation, first, the first switch S1 and the third switch S3 are conducted, and the second terminal of the third switch S2 is switched to the second terminal of the second resistor R2. Namely, the frequency signal FS has the logic high voltage level. The first to the fourth currents I1-I4 generated by the current generator 310 all have no low temperature coefficients, and a voltage generated when the third current I3 flows through the first resistor R1 and charges the first capacitor C1 to the voltage. Since the temperature coefficient of the third current I3 can counteract to the temperature coefficient of the first resistor R1, a voltage Vref of the first capacitor C1 have the low temperature coefficient. On the other hand, since the third switch S3 is conducted, the capacitor C2 is discharged, so that a voltage of the capacitor C2 is zero.

Next, the first switch S1 and the third switch S3 are not conducted, and the second terminal of the second switch S2 is switched to the second terminal of the third resistor R3. Namely, the frequency signal FS is converted from the logic high voltage level to the logic low voltage level. Now, the first to the fourth currents I1-I4 generated by the current generator 310 all have the low temperature coefficients. Since the third switch S3 is not conducted, the fourth current I4 with the low temperature coefficient can charge the second capacitor C2 until the voltage of the capacitor C2 reaches Vref. Then, the aforementioned steps are repeated, so that the comparator 351 can generate the frequency signal FS according to the low temperature coefficient voltage Vref and the low temperature coefficient fourth current I4 wherein the frequency signal FS also has the low temperature coefficient.

Figure 1:
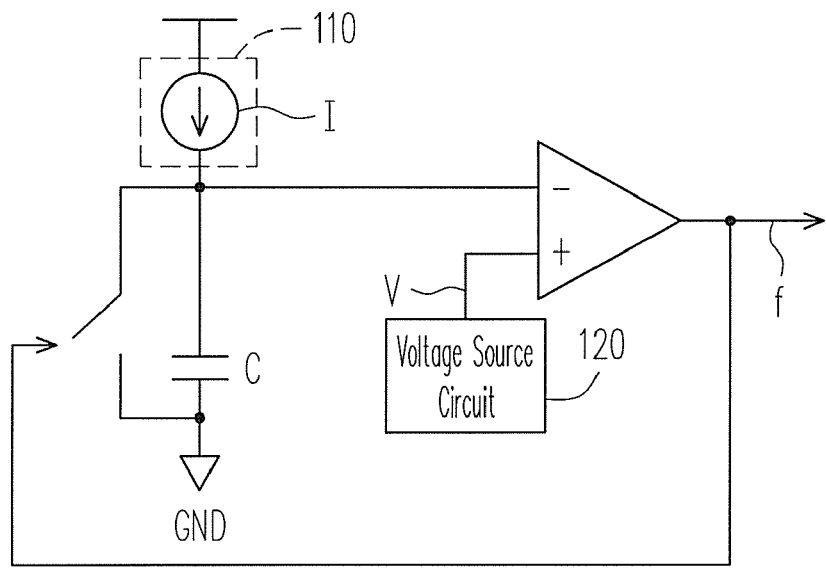
FIG. 1 is a schematic diagram illustrating a conventional silicon oscillator.
Figure 2A:
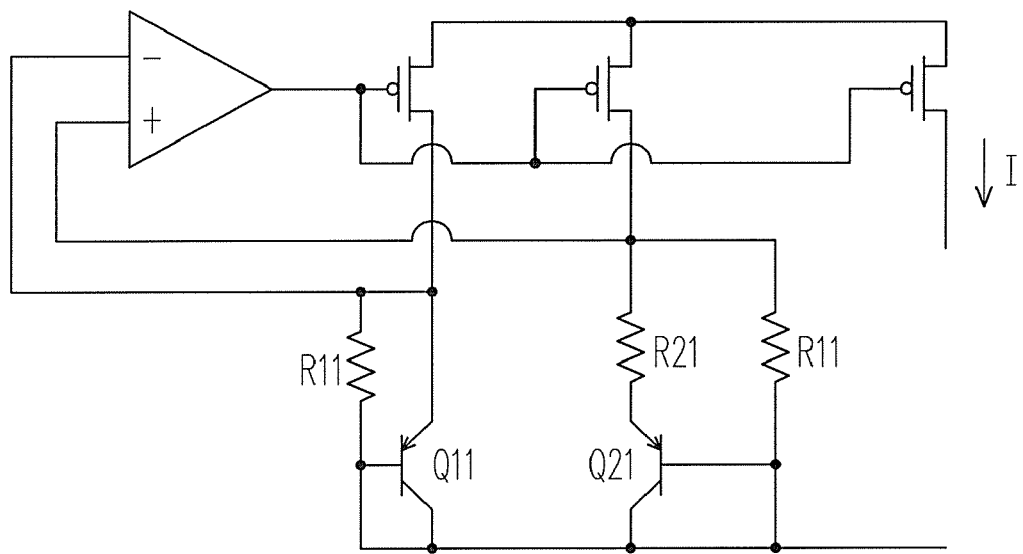
FIG. 2A is a circuit diagram illustrating a current source circuit of a silicon oscillator 100 of FIG. 1.
Figure 2B:
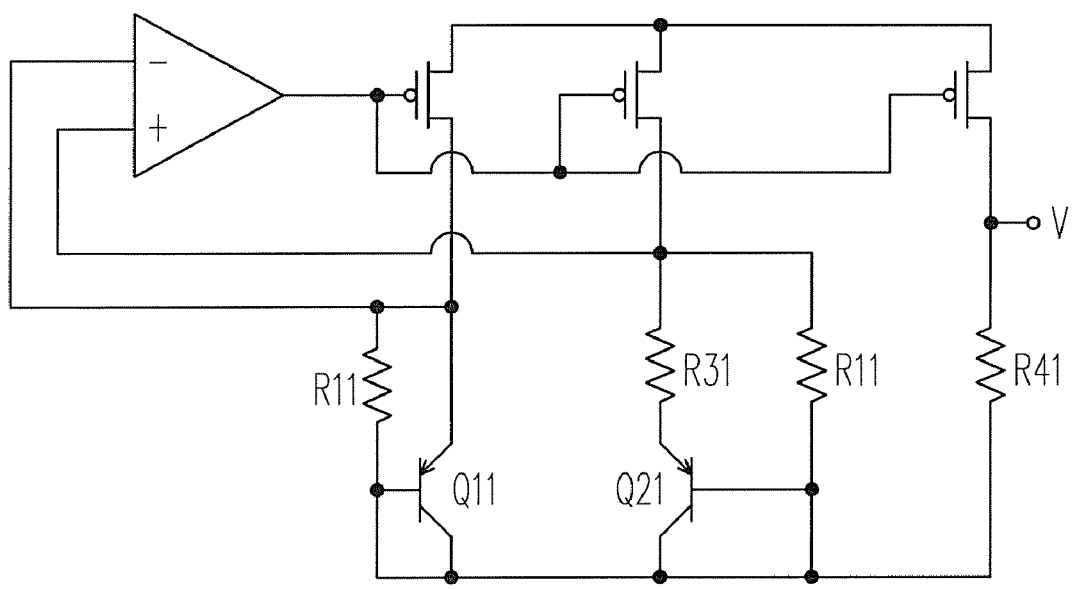
FIG. 2B is a circuit diagram illustrating a voltage source circuit of a silicon oscillator 100 of FIG. 1.

Since the low temperature coefficient oscillator 300 of the present embodiment does not need to apply a current source circuit and a voltage source circuit as that does in the silicon oscillator of FIG. 1, a circuit area of the low temperature coefficient oscillator 300 can be effectively reduced during a chip fabrication thereof. Moreover, since in the low temperature coefficient oscillator 300, the fifth transistor Q1, the sixth transistor Q2, the amplifier 340, the first transistor M1, the second transistor M2, the third transistor M3 and the fourth transistor M4 are shared, a fabrication process variation can contribute to the same temperature coefficient variation (k1(T)*|I4|, k2(T)*|Vref|, k1(T)=k2(T)) for the fourth current I4 and the voltage Vref of the first capacitor C1. Therefore, such variation can be counteracted in the low temperature coefficient oscillator 300 of the present embodiment, so that the frequency signal FS output by the comparator 351 can still maintain the low temperature coefficient (f~k(T)*|Iref|/C*k(T)*Vref=|Iref|/C*Vref). Moreover, the low temperature coefficient oscillator 300 of the present embodiment can also generate a sawtooth-like wave not varied with temperature variation.

Figure 4:
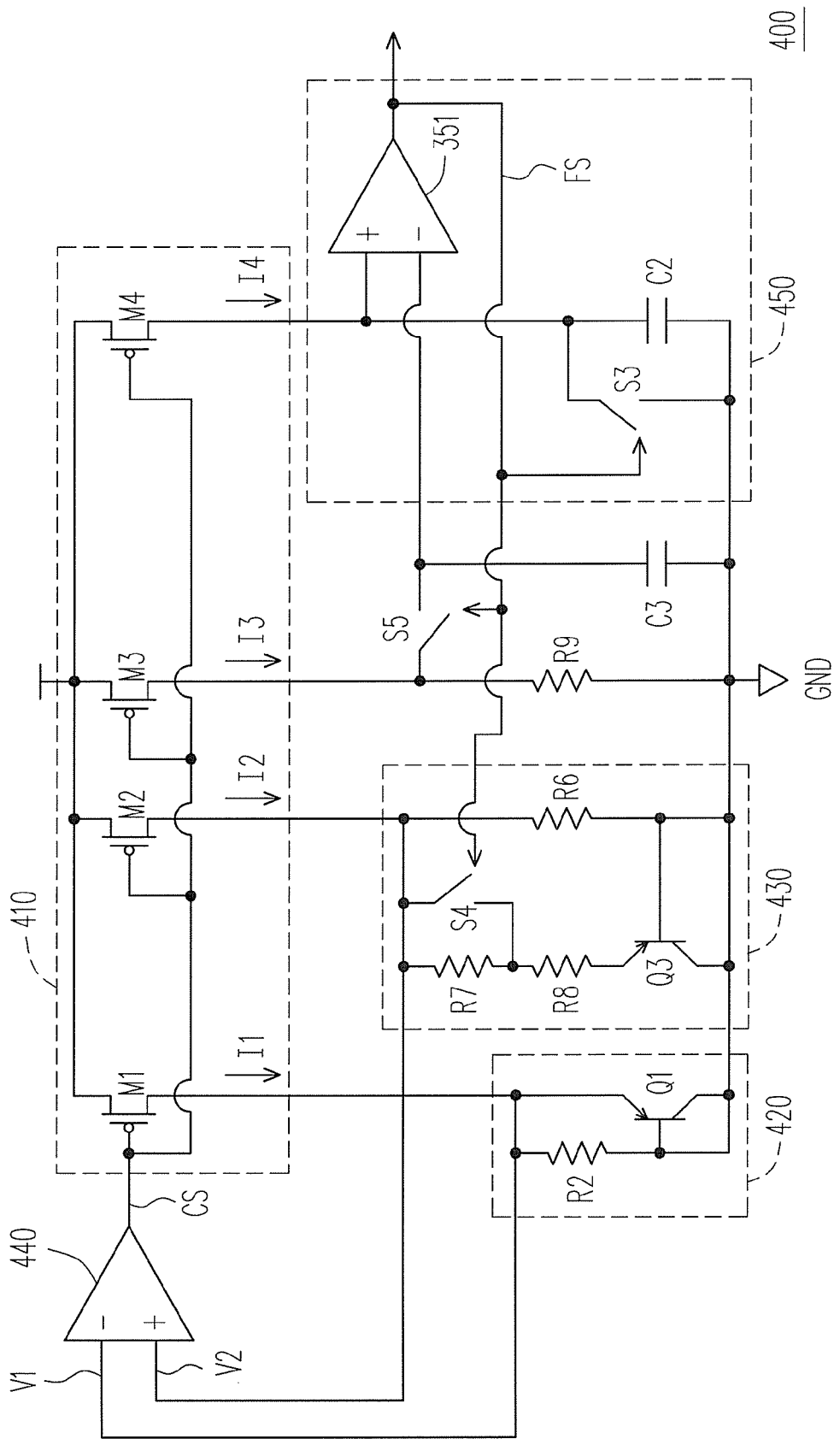
FIG. 4 is a schematic diagram illustrating a low temperature coefficient oscillator according to another embodiment of the present invention.

FIG. 4 is a schematic diagram illustrating a low temperature coefficient oscillator according to another embodiment of the present invention. Referring to FIG. 4, the low temperature coefficient oscillator 400 includes a current generator 410, a first voltage generator 420, a second voltage generator 430, an amplifier 440, a first resistor R9, a first switch S5, a first capacitor C3 and an oscillating unit 450. In the present embodiment, descriptions of the current generator 410, the first voltage generator 420, the amplifier 440, the first resistor R9, the first switch S5, the first capacitor C3 and the oscillating unit 450 are similar to that of the current generator 310, the first voltage generator 320, the amplifier 340, the first resistor R1, the first switch S1, the first capacitor C1 and the oscillating unit 350 of FIG. 3.

Moreover, the circuit structures and functions of the current generator 410, the first voltage generator 420 and the oscillating unit 450 are the same to that of the current generator 310, the first voltage generator 320 and the oscillating unit 350 of FIG. 3, so that related reference numerals of FIG. 3 are still used.

Referring to FIG. 4, the second voltage generator 430 includes a sixth resistor R6, a seventh transistor Q3, a seventh resistor R7, an eighth resistor R8 and a fourth switch S4. A first terminal of the sixth resistor R6 receives the second current I2 and generates the second voltage V2, and a second terminal of the sixth resistor R6 is coupled to the ground GND. A base and a collector of the seventh transistor Q3 are coupled to the second terminal of the sixth resistor R6. A first terminal of the seventh resistor R7 is coupled to the first terminal of the sixth resistor R6. A first terminal of the eighth resistor R8 is coupled to the first terminal of the seventh resistor R7, and a second terminal of the eighth resistor R8 is coupled to an emitter of the seventh transistor Q3.

A first terminal and a second terminal of the fourth switch S4 are respectively coupled to the first terminal and a second terminal of the seventh resistor R7, wherein the fourth switch S4 determines whether to be conducted according to the frequency signal FS. For example, when the frequency signal FS has the logic high voltage level, the fourth switch S4 is conducted, and when the frequency signal FS has the logic low voltage level, the fourth switch S4 is not conducted.

In the present embodiment, resistances of the sixth resistor R6 and the second resistor R2 are the same, a resistance of the seventh resistor R7 is, for example, an absolute value of a resistance of the fifth resistor R5 subtracting a resistance of the fourth resistor R4 of FIG. 3 (i.e. |R5−R4|), and a resistance of the eighth resistor R8 is, for example, a minimum value of the resistance of the fifth resistor R5 and the resistance of the fourth resistor R4 (i.e. Min (R5, R4)). Moreover, operations of the low temperature coefficient oscillator 400 of the present embodiment are similar to that of the low temperature coefficient oscillator 300 of FIG. 3, so that detailed descriptions thereof are not repeated.

In summary, in the present invention, whether the first switch is conducted is controlled by the frequency signal FS, so that the voltage of the first capacitor has the low temperature coefficient. On the other hand, the second voltage generator can adjust the second voltage according to the frequency signal FS, so that the current generated by the current generator can have the low temperature coefficient. By such means, the low temperature coefficient oscillator can generate the low temperature coefficient frequency signal according to the low temperature coefficient voltage and the low temperature coefficient current. Namely, the frequency signal is relatively not influenced by the temperature, so that the frequency signal can be stable, and a circuit area of the low temperature coefficient oscillator can be reduced during a chip fabrication thereof, and the first resistor having the temperature coefficient can be fabricated in the chip of the low temperature coefficient oscillator.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low temperature coefficient oscillator, comprising:
    a current generator, generating a first current, a second current, a third current and a fourth current according to a control signal;
    a first voltage generator, coupled to the current generator, and generating a first voltage according to the first current;
    a second voltage generator, coupled to the current generator, and generating a second voltage according to the second current and a frequency signal;
    an amplifier, generating the control signal according to the first voltage and the second voltage;
    a first resistor, having a first terminal receiving the third current, and a second terminal coupled to ground;
    a first switch, having a first terminal coupled to the first terminal of the first resistor, wherein the first switch is conducted or not according to the frequency signal;
    a first capacitor, having a first terminal coupled to a second terminal of the first switch, and a second terminal coupled to the ground; and
    an oscillating unit, generating the frequency signal according to the fourth current and a voltage of the first capacitor.

2. The low temperature coefficient oscillator as claimed in claim 1, wherein the current generator comprises:
    a first transistor, having a gate receiving the control signal, a source receiving a third voltage, and a drain generating the first current;
    a second transistor, having a gate receiving the control signal, a source receiving the third voltage, and a drain generating the second current;
    a third transistor, having a gate receiving the control signal, a source receiving the third voltage, and a drain generating the third current; and
    a fourth transistor, having a gate receiving the control signal, a source receiving the third voltage, and a drain generating the fourth current.

3. The low temperature coefficient oscillator as claimed in claim 1, wherein the first voltage generator comprises:
    a second resistor, having a first terminal receiving the first current and generating the first voltage, and a second terminal coupled to the ground; and
    a fifth transistor, having a base and a collector coupled to the second terminal of the second resistor, and an emitter coupled to the first terminal of the second resistor.

4. The low temperature coefficient oscillator as claimed in claim 3, wherein the second voltage generator comprises:
    a third resistor, having a first terminal receiving the second current and generating the second voltage, and a second terminal coupled to the ground;
    a sixth transistor, having a base and a collector coupled to the second terminal of the third resistor;
    a fourth resistor, having a first terminal coupled to an emitter of the sixth transistor;
    a fifth resistor, having a first terminal coupled to the first terminal of the fourth resistor; and
    a second switch, having a first terminal coupled to the first terminal of the third resistor, wherein a second terminal of the second switch is switched between a second terminal of the fourth resistor and a second terminal of the fifth resistor according to the frequency signal.

5. The low temperature coefficient oscillator as claimed in claim 3, wherein the oscillating unit comprises:
    a second capacitor, having a first terminal receiving the fourth current, and a second terminal coupled to the ground;
    a comparator, having a first terminal, a second terminal and an output terminal, wherein the first terminal of the comparator receives the fourth current, the second terminal of the comparator receives the voltage of the first capacitor, and the output terminal of the comparator generates the frequency signal; and
    a third switch, having a first terminal and a second terminal respectively coupled to the first terminal and the second terminal of the second capacitor, wherein the third switch determines whether to be conducted according to the frequency signal.

6. The low temperature coefficient oscillator as claimed in claim 3, wherein the second voltage generator comprises:

a sixth resistor, having a first terminal receiving the second current and generating the second voltage, and a second terminal coupled to the ground;

a seventh transistor, having a base and a collector coupled to the second terminal of the sixth resistor;

a seventh resistor, having a first terminal coupled to the first terminal of the sixth resistor;

an eighth resistor, having a first terminal coupled to the first terminal of the seventh resistor, and a second terminal coupled to an emitter of the seventh transistor; and a fourth switch, having a first terminal and a second terminal respectively coupled to the first terminal and a second terminal of the seventh resistor, wherein the fourth switch determines whether to be conducted according to the frequency signal.

* * * * *